United States Patent
Beste

(10) Patent No.: US 6,288,360 B1
(45) Date of Patent: Sep. 11, 2001

(54) EXCIMER LASER ABLATION PROCESS CONTROL OF MULTILAMINATE MATERIALS

(75) Inventor: Russell D. Beste, Mountain View, CA (US)

(73) Assignee: Aradigm Corporation, Hayward, CA (US)

( * ) Notice: Subject to any disclaimer, the term of this patent is extended or adjusted under 35 U.S.C. 154(b) by 0 days.

(21) Appl. No.: 09/353,125

(22) Filed: Jul. 14, 1999

(51) Int. Cl.[7] .............................. B23K 26/38; B23K 26/40
(52) U.S. Cl. ....................................... 219/121.71; 156/292
(58) Field of Search ........................... 219/121.7, 121.71, 219/121.72; 156/292

(56) References Cited

U.S. PATENT DOCUMENTS

| 4,508,749 | | 4/1985 | Brannon et al. . |
| 5,049,974 | * | 9/1991 | Nelson et al. . |
| 5,208,068 | * | 5/1993 | Davis et al. . |
| 5,236,551 | | 8/1993 | Pan . |
| 5,296,291 | | 3/1994 | Mueller . |
| 5,455,998 | | 10/1995 | Miyazono et al. ............... 219/121.71 |
| 5,498,306 | * | 3/1996 | Shibata et al. ........................ 156/292 |
| 5,536,579 | * | 7/1996 | Davis et al. ........................... 156/292 |
| 5,925,206 | * | 7/1999 | Boyke et al. . |
| 5,932,315 | * | 8/1999 | Lum et al. . |

FOREIGN PATENT DOCUMENTS

91/11329 * 8/1991 (WO) .............................. 219/121.72

* cited by examiner

Primary Examiner—Geoffrey S. Evans
(74) Attorney, Agent, or Firm—Bozicevic, Field & Francis; Paula A. Borden

(57) ABSTRACT

The instant invention discloses a method of ablating holes in a material, using a laminated material comprising first and second layers, said first and second layers having different coefficients of thermal expansion, said first layer having within it a hole, wherein a target region of said second layer in said laminated material is not laminated to said first layer but is surrounded entirely by laminated regions wherein the first layer is laminated to the second layer; providing a laser source producing energy of a wavelength and a power level that can ablate material from said first layer; changing the temperature of the laminated material so as to place said target region under tension; and directing said laser source onto said target region and ablating a portion thereof.

4 Claims, 1 Drawing Sheet

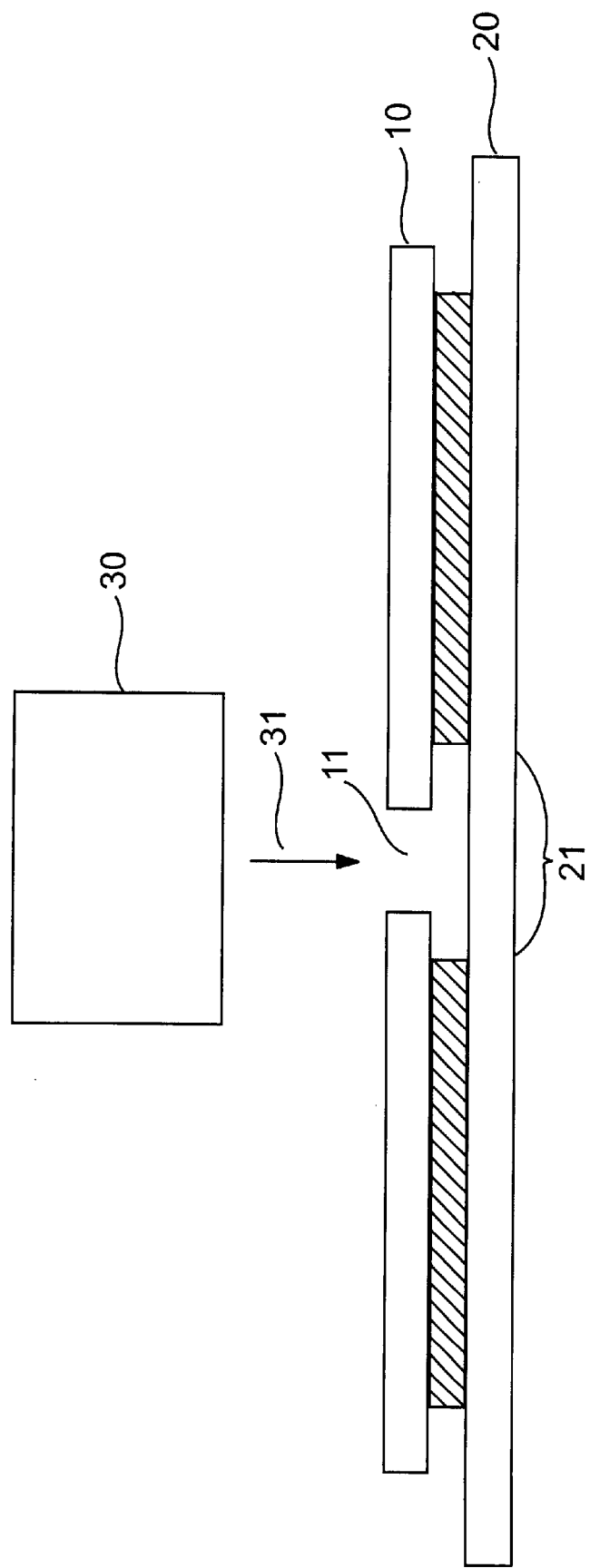

EXCIMER LASER ABLATION PROCESS CONTROL OF MULTILAMINATE MATERIALS

TECHNICAL FIELD

The instant invention relates to ablation patterning, particularly to ablation patterning of multilaminate materials.

BACKGROUND OF THE INVENTION

The use of ablation patterning of various polymeric materials, e.g., polyimides, is known. U.S. Pat. No. 4,508,749, for example, disclosed the use of ultraviolet (U.V.) radiation for etching through a polyimide layer. This patent is primarily directed to producing tapered openings through a polyimide layer for exposing surface areas of an underlying layer of metal. Electrical connections are then made through the openings to the metal layer. U.S. Pat. No. 5,236,551 likewise disclosed ablation etching for patterning a polymeric material layer which is then used as an etch mask for etch patterning, using wet or chemical etchants, an underlying layer of metal.

In a typical ablation process, a beam of laser energy is directed against an exposed surface of a body to be ablated. The laser energy is absorbed by the material and, as a result of photochemical, thermal and other effects, localized explosions of the material occur, driving away, for each explosion, tiny fragments of the material. The process requires that significant amounts of energy be both absorbed and retained within small volumes of the material until sufficient energy is accumulated in each small volume to exceed a threshold energy density al which explosions occur.

Polymeric materials, such as polyimides, are well suited for use in the process because such materials have a high absorptivity for U.V. light while having a relatively low thermal diffusivity for limiting the spread of the absorbed energy away from the volume where the energy was absorbed. Thus, the energy level quickly builds above the required energy density threshold.

When an excimer laser is used, because of the unique optical focusing requirements; of the excimer laser it is important to the manufacturing process that the material to be ablated flat, with a typical peak-to peak roughness of less than about 20 microns, i.e., ±10 microns for a given ablation operation. This need and others are addressed by the instant invention.

SUMMARY OF THE INVENTION

One aspect of the invention is a method of ablating holes in a material, the method comprising providing a laminated material comprising first and second layers, said first and second layers having different coefficients of thermal expansion, said first layer having within it a hole, wherein a target region of said second layer in said laminated material is not laminated to said first layer but is surrounded entirely by laminated regions wherein the first layer is laminated to the second layer; providing a laser source producing energy of a wavelength and a power level that can ablate material from said first layer, changing the temperature of the laminated material so as to place said target region under tension; and directing said laser source onto said target region and ablating a portion thereof. The coefficient of thermal expansion of the first laminates layer may be greater than or less than that of the second laminate layer.

A further aspect of the invention is a method of preparing a laminated material for laser ablation, comprising laminating a first layer to a second layer, wherein said first and second layers have different coefficients of thermal expansion, and wherein said second layer has an interior hole such that when the laminated substrate is formed, a region of the first layer aligned with said hole is not laminated to the second layer and is surrounded by laminated regions.

A further aspect of the invention is a laminated material comprising first and second layers, wherein said first and second layers have different coefficients of thermal expansion, and wherein said second layer has an interior hole such that a region of the first layer aligned with said hole is not laminated to the second layer and is surrounded by laminated regions.

BRIEF DESCRIPTION OF THE DRAWING

FIG. 1 depicts an exemplary embodiment of a method of ablating holes in a material. Cross hatching indicates regions of second layer that are laminated to first layer.

DETAILED DESCRIPTION OF THE INVENTION

Before the present method of excimer laser ablation process control is described, it is to be understood that this invention is not limited to the particular methodology, devices and formulations described, as such methods, devices and formulations may, of course, vary. It is also to be understood that the terminology used herein is for the purpose of describing particular embodiments only, and is not intended to limit the scope of the present invention which will be limited only by the appended claims.

It must be noted that as used herein and in the appended claims, the singular forms "a," "and," and "the" include plural referents unless the context clearly dictates otherwise. Thus, for example, reference to "a formulation" includes mixtures of different formulations, reference to "an analog" refers to one or mixtures of analogs, and reference to "the method of treatment" includes reference to equivalent steps and methods known to those skilled in the art, and so forth.

Unless defined otherwise, all technical and scientific terms used herein have the same meaning as commonly understood by one of ordinary skill in the art to which this invention belongs. Although any methods, devices and materials similar or equivalent to those described herein can be used in the practice or testing of the invention, the preferred methods, devices and materials are now described. All publications mentioned herein are incorporated herein by reference in their entirety for the purpose of describing and disclosing devices, formulations and methodologies which are described in the publication and which might be used in connection with the presently described invention.

Excimer laser ablation enables precise drilling and/or ablation processes to less than one micron. To be useful, however, many such ablated devices must be laminated to other polymeric materials. Since the ablation process is often very precise, it is useful from a manufacturing point of view in many instances to ablate the polymer after the lamination process. Furthermore, because of the unique optical focusing requirements of the excimer laser it is important to the manufacturing process that the material to be ablated be flat, with a typical peak-to peak roughness of less than about 20 microns, i.e., ±10 microns for a given ablation operation.

The typical of choice for excimer laser ablation is polyimide. Since polyimide has the lowest coefficient of expansion of most commonly used polymers, maintaining requisite flatness during an ablation process can be very difficult, as any change in temperature can cause materials (e.g., the polyimide component of the multilaminate) to become under compression. In such a scenario, surface flatness is no longer maintained. In order to maintain surface flatness for an ablation operation, it is desirable that the ablated material be under surface tension relative to its laminate layer.

The instant invention addresses this problem in a method exemplified in FIG. 1 which comprises providing a laminated material comprising first and second layers, said first and second layers having different coefficients of thermal expansion, said first layer 10 having within it a hole 11, wherein a target region 21 of said second layer 20 in said laminated material is not laminated to said first layer but is surrounded entirely by laminated regions wherein the first layer is laminated to the second layer; providing a laser source 30 producing energy (indicated by arrow 31) of a wavelength and a power level that can ablate material from said first layer; changing the temperature of the laminated material so as to place said target region under tension; and directing said laser source onto said target region and ablating a portion thereof. The coefficient of thermal expansion of the first laminate layer may be greater than or less than that of the second laminate layer.

The instant invention also provides a method of preparing a laminated material for laser ablation, comprising laminating a first layer to a second layer, wherein said first and second layers have different coefficients of thermal expansion, and wherein said second layer has an interior hole such that when the laminated substrate is formed, a region of the first layer aligned with said hole is not laminated to the second layer and is surrounded by laminated regions.

The instant invention also provides a laminated material comprising first and second layers, wherein said first and second layers have different coefficients of thermal expansion, and wherein said second layer has an interior hole such that a region of the first layer aligned with said hole is not laminated to the second layer and is surrounded by laminated regions.

Thus, in an embodiment where cooling of the laminate places the ablation material in tension, the lamination process will be conducted at an elevated temperature relative to the temperature at which the material will be drilled or ablated. An example of such a laminate is polyimide laminated to polyethylene, where the polyethylene layer has a small window relative to the total size of the laminate cut out where the laser ablation will occur. In this case, upon cooling after the lamination process, the window will enlarge during cooling, and put the polyimide in tension.

In an embodiment where heating of the laminate places the ablation material in tension, the lamination process will be conducted at a reduced temperature relative to the temperature at which the material will be ablated. Typically, a large window relative to the total size of the laminate is provides, such that the laminate heating results in window size growth, thereby placing the polyimide in tension.

What is claimed is:

1. A method of ablating holes in a material, comprising:

providing a laminated material comprising first and second layers, said first and second layers having different coefficients of thermal expansion, said first layer having within it a hole, wherein a target region of said second layer in said laminated material is not laminated to said first layer but is surrounded entirely by laminated regions wherein the first layer is laminated to the second layer;

providing a laser source producing energy of a wavelength and a power level that can ablate material from said first layer;

changing the temperature of the laminated material so as to place said target region under tension;

directing said laser source onto said target region and ablating a portion thereof.

2. The method of claim 1, wherein the coefficient of thermal expansion of the first laminate layer is greater than that of the second laminate layer.

3. The method of claim 1, wherein the coefficient of thermal expansion of the second laminate layer is greater than that of the first laminate layer.

4. A method of preparing a laminated material for laser ablation, comprising:

laminating a first layer to a second layer, wherein said first and second layers have different coefficients of thermal expansion, and wherein said second layer has an interior hole such that when the laminated substrate is formed, a region of the first layer aligned with said hole is not laminated to the second layer and is surrounded by laminated regions.

\* \* \* \* \*